United States Patent [19]
Shul et al.

[11] Patent Number: 5,624,529
[45] Date of Patent: Apr. 29, 1997

[54] DRY ETCHING METHOD FOR COMPOUND SEMICONDUCTORS

[75] Inventors: Randy J. Shul, Albuquerque, N.M.; Christopher Constantine, Safety Harbor, Fla.

[73] Assignee: Sandia Corporation, Albuquerque, N.M.

[21] Appl. No.: 437,532

[22] Filed: May 10, 1995

[51] Int. Cl.$^6$ .................................................. H01L 21/00
[52] U.S. Cl. ........................... 438/718; 216/67; 438/39; 252/79.1
[58] Field of Search .................. 252/79.1, 79.4; 156/643.1, 657.1, 662.1, 649.1; 216/67

[56] References Cited

U.S. PATENT DOCUMENTS

| | | | |
|---|---|---|---|
| 4,030,967 | 6/1977 | Ingrey | 156/643 |
| 4,618,398 | 10/1986 | Nawata | 156/643 |
| 5,034,092 | 7/1991 | Lebby | 156/646 |
| 5,068,007 | 11/1991 | Rogers | 156/643 |
| 5,211,804 | 5/1993 | Kobayashi | 156/665 |
| 5,338,394 | 8/1994 | Faithmulla et al. | 156/643.1 |

OTHER PUBLICATIONS

R. H. Bruce and G.P. Malafsky, "High Rate Anisotropic Aluminum Etching," *Journal of the Electrochemical Society*, vol. 130, pp. 1369–1373, Jun. 1983.

T. R. Hayes, M. A. Dreisbach, P. M. Thomas, W. C. Dautremont-Smith, and L. A. Heimbrook,"Reactive Ion Etching of InP Using $CH_4/H_2$ Mixtures: Mechanisms of Etching and Anisotropy," *Journal of Vacuum Science and Technology*, vol. B7, pp. 1130–1140, Sep. 1989.

S. J. Pearton, U. K. Chakrabarti, and A. P. Kinsella, "Electron Cyclotron Resonance Plasma Etching of InP in $CH_4/H_2/Ar$," *Applied Physics Letters*, vol. 56, pp. 1424–1426, 9 Apr. 1990.

C. Constantine and D. Johnson, "Plasma Etching of III–V Semiconductors in $CH_4/H_2/Ar$ Electron Cyclotron Resonance Discharges," *Journal of Vacuum Science and Technology*, vol. B8, pp. 596–606, Jul. 1990.

J. Hommel, M. Moser, M. Geiger, F. Scholtz, and H. Schweizer, "Investigations of Dry Etching In AlGaInP/GaInP Using $CCl_2F_2/Ar$ Reactive Ion Etching and Ar Ion Beam Etching," *Journal of Vacuum Science and Technology*, vol. B9, pp. 3526–3529, Nov 1991.

J. W. McNabb, H. G. Craighead, H. Temkin, and R. A. Logan, "Anisotropic Reactive Ion Etching of InP in Methane/Hydrogen Based Plasmas," *Journal Of Vacuum Science and Technology*, vol. B9, pp. 3535–3537, Nov. 1991.

S.J. Pearton, U. K. Chakrabarti, A. Katz, F. Ren, and T. R. Fullowan, "High–Rate, Anisotropic Dry Etching of InP in HI–Based Discharges," *Applied Physics Letters*, vol. 60, pp. 838–840, 17 Feb. 1992.

S. J. Pearton, U. K. Chakrabarti, E. Lane, A. P. Perley, C. R. Abernathy, and W. S. Hobson, "Characteristics of III–V Dry Etching in HBr–Based Discharges," *Journal of the Electrochemical Society*, vol. 139, pp. 856–864, Mar. 1992.

J. R. Lothian, J. M. Kuo, F. Ren, and S. J. Pearton, "Plasma and Wet Chemical Etching of $In_{0.5}Ga_{0.5}P$," *Journal of Electronic Materials*, vol. 21, No. 4, pp. 441–445, 1992.

(List continued on next page.)

*Primary Examiner*—William Powell
*Attorney, Agent, or Firm*—John P. Hohimer

[57] ABSTRACT

A dry etching method. According to the present invention, a gaseous plasma comprising, at least in part, boron trichloride, methane, and hydrogen may be used for dry etching of a compound semiconductor material containing layers including aluminum, or indium, or both. Material layers of a compound semiconductor alloy such as AlGaInP or the like may be anisotropically etched for forming electronic devices including field-effect transistors and heterojunction bipolar transistors and for forming photonic devices including vertical-cavity surface-emitting lasers, edge-emitting lasers, and reflectance modulators.

17 Claims, 1 Drawing Sheet

OTHER PUBLICATIONS

C. Constantine, C. Barratt, S. J. Pearton, F. Ren, and J. R. Lothian, "Microwave $Cl_2/H_2$ Discharges for High Rate Etching of InP," *Electronics Letters*, vol. 28, pp. 1749–1750, 27 Aug. 1992.

T. Yoshikawa, Y. Sugimoto, H. Yoshii, H. Kawano, S. Kohmoto, and K. Asakawa, "Smooth Vertical Etching of AlGaInP by $Cl_2$ Reactive Ion Beam Etching," *Electronics Letters*, vol. 29, pp. 190–192, 21 Jan. 1993.

T. Yoshikawa, Y. Sugimoto, H. Hotta, K. Tada, H. Kobayashi, H. Yoshii, H. Kawano, S. Kohmoto, and K. Asakawa, "GaInP/AlGaInP Index Waveguide–Type Visible Laser Diodes with Dry–Etched Mesa Stripes," *Electronics Letters*, vol. 29, pp. 1690–1691, 16 Sep. 1993.

S. S. Ou J.J. Yang, and M. Jansen, "635 nm GaInP/GaAlInP Surface–Emitting Laser Diodes," *Applied Physics Letters*, vol. 63, pp. 3262–3264, 13 Dec. 1993.

R. J. Shul, R. P. Schneider, and C. Constantine, "Anisotropic Electron Cyclotron Resonance Etching of GaInP/AlGaInP Heterostructures," *Electronics Letters*, vol. 30, pp. 817–819, 12 May 1994.

DRY ETCHING METHOD FOR COMPOUND SEMICONDUCTORS

This invention was made with Government support under Contract No. DE-AC04-94AL85000 awarded by the U.S. Department of Energy. The Government has certain rights in the invention.

FIELD OF THE INVENTION

The present invention relates to a method for dry etching of III–V compound semiconductors, and particularly to a gaseous plasma etching method for III–V compound semiconductor materials having layers comprised of alloys including aluminum, or indium or both.

BACKGROUND OF THE INVENTION

III–V compound semiconductor materials have applications for the formation of electronic devices such as field-effect transistors (FETs) and heterojunction bipolar transistors (HBTs) and the like; and for the formation of photonic devices such as vertical-cavity surface-emitting lasers (VCSELs), edge-emitting lasers, reflectance modulators, and the like. For many of these compound semiconductor devices, a precision etching is required for defining the device structure and/or electrically isolating adjacent devices. A dry etching method is to be preferred over a wet etching method due to being cleaner, having a greater repeatability, providing more anisotropic and higher-aspect etch profiles, providing an improved etch depth control and uniformity across a substrate or wafer, and allowing a smaller size of etchable structures. Dry etching is also independent of surface orientation, allowing the formation of substantially vertical etch sidewalls, even on misoriented substrates that may be preferred for the growth of some compound semiconductor materials such as InGaP and AlGaInP.

Compound semiconductor materials formed of one or more layers that include both aluminum and indium (e.g. AlGaInP or the like) have been particularly difficult to etch since both aluminum and indium tend to make dry etching result in a rough surface texture for the compound semiconductor material.

The present invention represents an advance over the prior art dry etching methods used heretofore for etching of compound semiconductor materials.

S. J. Pearton et al disclose the use of hydrogen iodide (HI) in combination with methane and hydrogen for electron cyclotron resonance (ECR) plasma etching of InP, InGaAs, InAlAs, InAlP, InAs, and InSb in an article entitled "High-Rate Anisotropic Dry Etching of InP in HI-Based Discharges," Applied Physics Letters, volume 60, pages 838–840, 17 February 1992. A disadvantage of such HI-based discharges are that they are known to be extremely corrosive.

T. Yoshikawa et al disclose dry etching of AlGaInP in a chlorine reactive ion beam apparatus in an article entitled "Smooth Vertical Etching of AlGaInP by Cl2 Reactive Ion Beam Etching," Electronics Letters, volume 29, pages 190–192, 21 January 1993. Yoshikawa et al disclose that any residual water vapor in the etching chamber can oxidize the Al resulting in retarded etching and a rough etched surface. For this reason, a lengthy preparation time (over 8 hours) was required for evacuation of the etching chamber (to $4\times10^{-8}$ torr) and baking of the chamber and gas lines prior to etching. Such a lengthy preparation time is disadvantageous in reducing throughput and thereby increasing manufacturing cost. Furthermore, the high chlorine ion beam energy of about 1 keV is disadvantageous in producing damage to the compound semiconductor material which is undesirable for many types of sensitive compound semiconductor devices.

S. S. Ou et al disclose dry etching of GaInP/GaAlInP surface-emitting laser diodes having 45° and 90° deflecting micromirrors by argon ion beam etching in an article entitled "635 nm GaInP/GaAlInP Surface-Emitting Laser Diodes," Applied Physics Letters, volume 63, pages 3262–3264, 13 December 1993. The use of an argon ion beam for etching GaInP and GaAlInP is disadvantages due to a low etching rate of only about 30 nm/minute, and also due to damage to the compound semiconductor material produced by the 0.5 keV energy of the Ar ion beam.

What is needed is a dry etch method that is capable of etching compound semiconductor materials containing aluminum, and/or indium while providing a relatively high etch rate of up to about 50 nm/minute or higher, and smooth etched surfaces with minimal ion bombardment damage.

SUMMARY OF THE INVENTION

Accordingly, it is a primary object of the present invention to provide a method for dry etching that provides a high speed and accurate anisotropic etching of III–V compound semiconductors containing aluminum and/or indium.

Another object of the present invention is to provide a method for dry etching that provides smooth etched surfaces and/or trenches.

A further object of the present invention is to provide a method that uses a low and adjustable ion bombardment energy of about 200 eV or less to control and limit ion bombardment damage to the compound semiconductor.

Additional objects, advantages, and novel features of the invention will become apparent to those skilled in the art upon examination of the following description, or may be learned by practice of the invention. The objects and advantages of the invention may be realized and attained by means of the instrumentalities and combinations particularly pointed out in the appended claims.

To achieve the foregoing and other objects, and in accordance with the purposes of the present invention as described herein, a method for etching a III–V compound semiconductor comprises placing a semiconductor substrate on which the compound semiconductor material has been deposited in a plasma reactor; and exposing a part of the compound semiconductor material to be etched to a gaseous plasma comprising at least in part boron trichloride ($BCl_3$), methane ($CH_4$), and hydrogen ($H_2$). In a preferred embodiment of the present invention, the gaseous plasma further includes a nonreactive or inert gas such as argon (Ar) or the like.

DETAILED DESCRIPTION OF THE INVENTION

Figure 1:
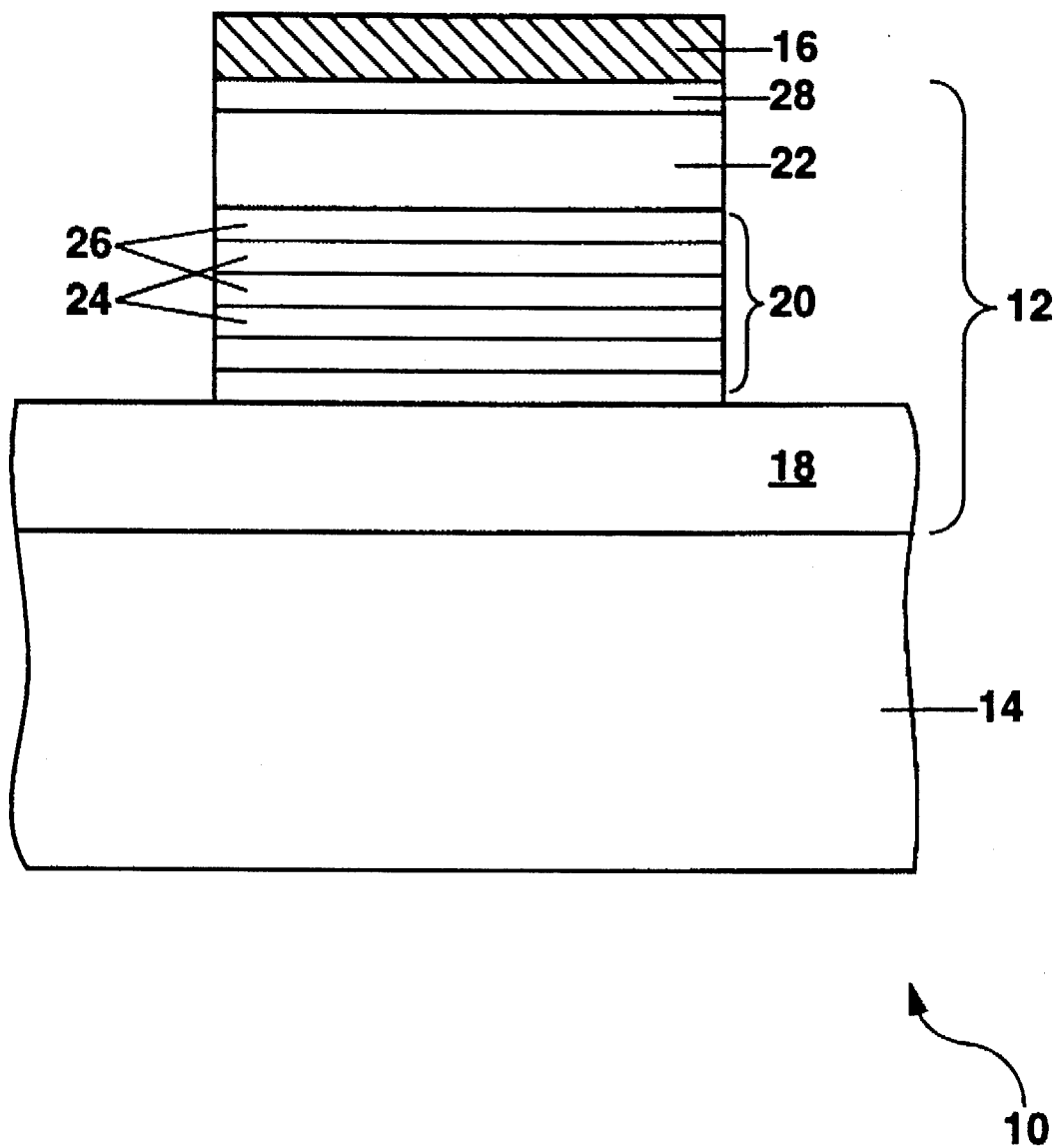
FIGURE 1 shows a schematic diagram of an example of a semiconductor substrate having a layered compound semiconductor material thereupon, with a part of the compound semiconductor material being anisotropically etched by the dry etching method of the present invention to form a mesa-like structure for a reflectance modulator.

The dry etching method of the present invention may be explained with the aid of an example of a compound semiconductor device formed by etching downward through a compound semiconductor material that includes one or more layers containing both aluminum (Al) and indium (In). The device of this example, as shown in FIGURE 1, is a reflectance modulator 10 having a structure defined at least in part according to dry etching method of the present invention. The reflectance modulator 10 comprises a III–V compound semiconductor material 12 epitaxially deposited on a substrate 14 by metal-organic chemical vapor deposition (MOCVD), molecular beam epitaxy (MBE), or the like.

The dry etch method of the present invention may be used to form a mesa-like device region in the compound semiconductor material 12 or trenches for electrically isolating adjacent devices 10 as defined by a patterned masking layer 16 such as a resist, $SiO_2$, $Si_3N_4$, or the like. The masking layer 16 may be applied to a top surface of the compound semiconductor material 12 by a deposition or spin-on process, and patterned by lift-off or conventional plasma etching (e.g. using a $CF_4/O_2$ or $CHF_3/O_2$ plasma for reactive ion etching of $SiO_2$ and $Si_3N_4$, respectively). The masking layer 16 may be used to protect a device portion of the compound semiconductor material 12, and to provide for exposing of a part of the material to a gaseous plasma for etching thereof.

The substrate 14 may be, for example, gallium arsenide (GaAs), indium phosphide (InP), or the like as used for the epitaxial deposition of III–V compound semiconductor materials for the fabrication of electronic and/or photonic devices. Furthermore, the substrate 14 may be misoriented at an angle to a cleavage plane therein as an aid in growing ternary or quaternary semiconductor alloy layers within the compound semiconductor material 12.

The compound semiconductor material 12 is epitaxially deposited on the substrate 14 and preferably comprises a plurality of layers that, in the example of a reflectance modulator, forms a p-i-n semiconductor diode structure. In other electronic or photonic devices, the compound semiconductor material 12 may include one or more layers formed of a compound semiconductor alloy including elements selected from the group consisting of Al, In, Ga, As, and P, with adjacent layers generally having a different semiconductor alloy composition, or doping or both.

To form a reflectance modulator 10 for use at visible wavelengths, according to the above example, a first cladding layer 18 may comprise either a 600-nm-thick layer of n-type $Al_{0.5}In_{0.5}P$ or a 200-nm-thick layer of n-type $Al_{0.5}Ga_{0.5}As$ grown on an n-doped GaAs substrate by MOCVD at a temperature of about 775° C. An undoped multi-quantum-well active region 20 having a total thickness of about 500 nm and comprising 25.5 periods of quantum-well layers is grown above the first cladding layer 18 in the example of FIGURE 1. Each period of the active region 20 is formed from a 10-nm-thick $In_{0.49}Ga_{0.51}P$ quantum-well layer 24 and an adjacent 10-nm-thick $(Al_{0.5}Ga_{0.5})_{0.51}In_{0.49}P$ barrier layer 26. A second cladding layer 22 above the active region 20 comprises a 200-nm-thick layer of either p-type $Al_{0.5}In_{0.5}P$ or p-type $Al_{0.5}Ga_{0.5}As$. A 10-nm-thick $p^+$-doped GaAs cap layer 28 is grown above the second cladding layer 22 for facilitating an electrical contact on the top side of the device 10.

To define the mesa-like structure of the reflectance modulator 10, an anisotropic dry etching method is preferred for etching downward at least part way through the layers of the compound semiconductor material 12 as shown in FIGURE 1. The dry etching is preferably performed in an electron cyclotron resonance (ECR) reactor, although other types of etching reactors including reactive ion etching (RIE), reactive ion beam etching (RIBE), ion beam etching (IBE), and the like may be used for practice of the present invention.

An ECR reactor is to be preferred for the formation of sensitive compound semiconductor devices since the ion energies may be controlled and adjusted to about 200 eV or less to minimize ion bombardment damage to the compound semiconductor lattice and also to minimize possible erosion of the masking layer 16 during a long plasma exposure that may be required for etching up to several microns of material to form the device structure. In the ECR reactor excited by microwave power, free electrons in a gaseous plasma are forced to orbit about magnetic field lines within the reactor while absorbing energy from the microwaves at a frequency of about 2.45 GHz. At a cyclotron resonance condition, outer shell electrons may be liberated from gas molecules introduced into the plasma, thereby leading to a very high degree of ionization in the plasma. Since the motion of the electrons is constrained by the magnetic field in the reactor, fewer electrons are lost by collisions with the reactor walls than in conventional radio frequency (rf) plasma reactors (e.g. RIE reactors); and therefore an electrical potential of the plasma relative to the semiconductor substrate or wafer mounted on a platform electrode held at ground potential is much lower. The resultant low energy of ions reaching a workpiece (e.g. the reflectance modulator 10) to be etched therefore results in much lower levels of ion bombardment damage than for conventional etching reactors, including RIE, RIBE, and IBE.

In dry etching by a plasma, etchant gas molecules are introduced into the plasma reactor and broken up into chemically active ions or radicals that may react with an exposed part of the workpiece; and etching occurs at a predetermined rate until terminated by removing the workpiece, reaching an etch-stop layer in the workpiece comprising a semiconductor alloy that is substantially non-reactive to the chemically active radicals, or until switching off the plasma or flow of etchant gas. For useful etch rates, it is preferred that reaction products produced by etching the compound semiconductor material 12 have a vapor pressure of about 1 millitorr or greater at a temperature for etching the workpiece.

A compound semiconductor material 12 having one or more layers comprising both aluminum and indium group III elements (e.g. AlGaInP) is known to be difficult to etch using prior-art dry etching methods as described heretofore.

According to the present invention, one or more layers comprising a compound semiconductor alloy including aluminum, or indium or both may be readily etched with a gaseous plasma comprising at least in part boron trichloride, methane, and hydrogen. The semiconductor alloy composition of each layer may further include one or more group III and/or group V elements such as gallium (Ga), arsenic (As), and phosphorous (P), and combinations thereof.

Boron trichloride may be used according to the present invention for etching aluminum in each aluminum-containing layer, and for removing any oxides of aluminum ($Al_2O_3$) that may be present on or within the aluminum-containing layers. $BCl_3$ may be supplied to the plasma at a flow rate in the range of about 2–25 standard cm$^3$/minute (sccm) when an ECR plasma reactor is used for practice of the present invention. In the plasma, $BCl_3$ likely dissociates into $BCl_x$ and Cl radicals, with the $BCl_x$ radicals thought to be responsible for removing any $Al_2O_3$ and possibly generating a volatile oxychloride. The Cl radicals provided by the plasma are not significant for removing $Al_2O_3$, but instead are available for etching aluminum with the generation of volatile $AlCl_3$. For this reason, an etchant gas containing only $Cl_2$ is ineffective in etching aluminum-containing compound semiconductor layers.

$Cl_2$, however, may be added to the plasma (at a flow rate of up to about 50 sccm for an ECR plasma reactor) in addition to the $BCl_3$ to provide additional Cl radicals to increase the etching rate for aluminum. The addition of $Cl_2$ to the plasma may also be preferred for dry etching compound semiconductor materials 12 that include a GaAs cap layer 28, since $Cl_2$ provides a high etch rate for Ga-based compound semiconductors such as GaAs.

The methane provided in the gaseous plasma acts to etch indium, with methyl radicals thought to be responsible for removing indium as a volatile organometallic compound trimethylindium [$(CH_3)_3In$]. The methane further acts to improve the surface morphology for etching by providing smoother etched surfaces than for a gaseous plasma excluding methane. In the case of an ECR plasma reactor, methane may be provided to the plasma at a flow rate in the range of about 1–20 sccm.

For dry etching compound semiconductor materials 12 according to the present invention, $H_2$ must also be added to the plasma (at a flow rate of about 1 to 50 sccm for an ECR plasma reactor) for the volatilization of group V elements (e.g. As, P, Sb which desorb as $AsH_3$, $PH_3$, and $SbH_3$ respectively) in each layer.

Dilution of the etchant gases with a nonreactive inert gas such as argon (Ar) may be preferred for control and adjustment of the etch rate in the layered material 12. Such dilution with a nonreactive inert gas such as Ar may also be advantageous for stabilizing the plasma, for increasing the desorption of etch reaction products through increased ion bombardment of the material 12 being etched, and for minimizing the possibility for polymer deposition on the compound semiconductor material. In the case of an ECR plasma reactor, Ar may be supplied to the plasma at a flow rate in the range of about 5–25 sccm.

For plasma etching, the workpiece (i.e. the substrate 14 and overlying compound semiconductor material 12 with a patterned masking layer 16 thereupon) is loaded onto the platform electrode (e.g. a lower electrode) within the reactor, with the platform electrode and semiconductor substrate 14 thereon being maintained by heating or cooling at a preset temperature (typically in the range of about 10° to 250° C.) during etching. The reactor is then evacuated, the etchant gases are introduced, and etching begins when the gaseous plasma is initiated. Completion of the etch cycle can be monitored either visually, or by means of laser reflectometry, an etch-rate or thickness sensor, or the like.

A preferred reactor for practice of the present invention is an ECR plasma reactor, with the plasma being initiated and excited by microwaves at a frequency of about 2.45 GHz, and at a microwave power level of up to 1000 Watts or more. It is further preferred that the ECR plasma reactor include means for controlling and modifying the ion bombardment energy such as an rf bias (preferably at a frequency of about 13.56 MHz) applied to the platform electrode holding the workpiece to be etched for generating a direct-current (dc) self-bias voltage on the workpiece. During etching, the self-bias voltage may be controlled by the rf power supplied to the platform electrode holding the workpiece; thereby controlling, at least in part, the rate for etching of the compound semiconductor material 12. The use of an rf power in the range of about 0–250 Watts may provide a self-bias voltage of from 0 to about –200 Volts. For other types of plasma reactors as known to the art (e.g. RIE, RIBE, IBE), the relative amounts and flow rates of $BCl_3$, $Cl_2$, $CH_4$, $H_2$, and Ar, and the exact plasma reactor operating conditions (e.g. rf input power, self-bias voltage, operating pressure, and workpiece temperature) may readily be determined from practice of the present invention.

The ECR plasma reactor, preferred for practice of the present invention, may be evacuated with a high-speed vacuum pump to an operating pressure in the range of about 0.5 to 20 millitorr or higher, and preferably about 1–2 millitorr. An ECR source in the reactor may be of a multipolar, tuned-cavity design providing a field-free region about the workpiece at 0 self-bias voltage. Such an ECR reactor has been described in detail, for example, in an article by C. Constantine, D. Johnson, S. J. Pearton, U. K. Chakrabarti, A. B. Emerson, W. S. Hobson, and A. P. Kinsella, "Plasma Etching of III–V Semiconductors in CH4/H2/Ar Electron Cyclotron Resonance Discharges," Journal of Vacuum Science and Technology, volume B8, pages 596–606, July/August 1990 which is incorporated herein by reference.

The etchant gases $BCl_3$, $CH_4$, $Cl_2$, $H_2$, and Ar are introduced into the ECR plasma reactor through mass flow controllers to provide a preferred flow rate of at least 10 sccm. The relative flow rates of $BCl_3$, $CH_4$, $Cl_2$, $H_2$, and Ar are important in controlling the etch rate, surface stoichiometry (i.e. surface roughness), and anisotropy of the workpiece. The etch rates obtained will also, in general, depend on the composition and layer structure of the compound semiconductor material 12 and the exact reactor conditions (including the plasma composition, self-bias voltage, and platform electrode temperature).

In the example of FIGURE 1, the GaAs cap layer 16 may be removed prior to etching the AlInP or AlGaAs cladding layers (18 and 22) and the GaInP/AlGaInP active region 20 by a $Cl_2$/Ar ECR plasma etch. The $Cl_2$/Ar ECR plasma etch may be performed, for example, for about 1.5 minutes at a total pressure of about 1 millitorr, with etchant gas flow rates of about 8 sccm $Cl_2$ and 40 sccm Ar, an applied microwave power of about 850 Watts, and a self-bias voltage of about –60 Volts (due to about 150 Watts rf power).

For etching the AlInP or AlGaAs cladding layers (18 and 22) and the GaInP/AlGaInP active region 20 in the example of FIGURE 1, a preferred plasma composition is about 5 sccm $BCl_3$, 2 sccm $CH_4$, 10 sccm $Cl_2$, 20 sccm $H_2$ and 10 sccm Ar with the total pressure in the ECR plasma reactor being about 2 millitorr. Other etch parameters for the example of FIGURE 1 are a workpiece temperature of about 170° C., an applied microwave power of about 850 Watts, and an rf power of about 200 Watts for providing a self-bias voltage of about –130 Volts. Under these conditions, the dry etch is highly anisotropic with a substantially smooth surface morphology (e.g. specular surfaces and straight sidewalls) as determined by scanning electron microscopy (SEM). The average etch rate for the compound semiconductor material 12 under these conditions as determined by stylus profilometry (after removal of the masking layer 16) is about 200 to 300 nm/minute.

After etching, the reflectance modulator 10 may be completed by depositing and patterning a Ti/Au ring electrode upper electrode above the GaAs cap layer 28 and a full-surface GeNiAu lower electrode below the substrate 14.

For fabrication of other types or layer compositions of compound semiconductor devices, the above operating parameters (including etchant gas flow rates) for dry etching of a compound semiconductor material including layers containing aluminum, or indium or both may be different, and may be determined frown practice of the present invention.

The matter set forth in the foregoing description and accompanying drawings is offered by way of illustration only and not as a limitation. Other applications and variations of the precision cleaning apparatus and method will become evident to those skilled in the art. The actual scope of the invention is intended to be defined in the following claims when viewed in their proper perspective based on the prior art.

What is claimed is:

1. A method for etching a III–V compound semiconductor material comprising:
   (a) placing a semiconductor substrate on which the compound semiconductor material has been deposited on a platform electrode within a plasma reactor; and
   (b) exposing a part of the compound semiconductor material to be etched to a gaseous plasma comprising an etchant gas including at least in part boron trichloride, methane, and hydrogen.

2. The method of claim 1 in which the gas plasma further includes all least one gas selected from the group consisting of chlorine and an inert gas.

3. The method of claim 2 in which the inert gas is argon.

4. The method of claim 1 in which the compound semiconductor material comprises a plurality of layers with adjacent layers having different semiconductor alloy compositions, and including the step of etching at least part way through the layers.

5. The method of claim 4 in which the layers are formed from semiconductor alloys comprising elements selected from the group consisting of Al, In, Ga, As, and P.

6. The method of claim 5 in which at least one of the layers includes both aluminum and indium.

7. The method of claim 1 in which the plasma reactor is an electron cyclotron resonance reactor.

8. The method of claim 7 in which the boron trichloride is provided to the plasma reactor at a flow rate in the range of about 2 to 25 standard $cm^3$ per minute, the methane is provided to the plasma reactor at a flow rate in the range of about 1 to 20 standard $cm^3$ per minute, and the hydrogen is provided to the plasma reactor at a flow rate in the range of about 1 to 50 standard $cm^3$ per minute.

9. The method of claim 8 further including the steps of providing argon to the plasma reactor at a flow rate in the range of about 5 to 25 standard $cm^3$ per minute, and providing chlorine to the plasma reactor at a flow rate of up to about 50 standard $cm^3$ per minute.

10. The method of claim 8 further including the step of maintaining an operating pressure in the plasma reactor in a range of about 0.5 millitorr to about 20 millitorr.

11. The method of claim 10 including adjusting the operating pressure to substantially 2 millitorr.

12. The method of claim 1 further including the step of maintaining the semiconductor substrate within a temperature range from about 10° C. to about 250° C. during etching.

13. The method of claim 1 in which the semiconductor substrate is maintained at a temperature of substantially 170° C. during etching.

14. A dry etching method wherein a gaseous mixture of boron trichloride, chlorine, methane, and hydrogen is used as an etching gas, and the etching gas is converted into a plasma for etching a compound semiconductor material including at least one layer of a compound semiconductor alloy including aluminum and indium.

15. A method for forming a compound semiconductor device comprising the following steps:
   (a) patterning; a masking layer to define an area of the device to be etched; and
   (b) exposing the defined area to a gaseous plasma comprising boron trichloride, methane, and hydrogen.

16. The method of claim 15 in which the gaseous plasma further includes at least one gas selected from the group consisting of chlorine and argon.

17. The method of claim 15 wherein the compound semiconductor device is selected from the group consisting of field-effect transistors, heterojunction bipolar transistors, reflectance modulators, vertical-cavity surface-emitting lasers, edge-emitting lasers, and combinations thereof.

* * * * *